(12) United States Patent
Siggers

(10) Patent No.: US 6,525,654 B1
(45) Date of Patent: Feb. 25, 2003

(54) VEHICLE ELECTRICAL CIRCUIT FAILURE MONITOR

(75) Inventor: Henry Robert Siggers, Essex (GB)

(73) Assignee: Nighthawk (TLM) Limited, Saffron Walden (GB)

( * ) Notice: Subject to any disclaimer, the term of this patent is extended or adjusted under 35 U.S.C. 154(b) by 0 days.

(21) Appl. No.: 09/786,288

(22) PCT Filed: Sep. 2, 1999

(86) PCT No.: PCT/GB99/02896

§ 371 (c)(1),
(2), (4) Date: Mar. 2, 2001

(87) PCT Pub. No.: WO00/14554

PCT Pub. Date: Mar. 16, 2000

(30) Foreign Application Priority Data

Sep. 2, 1998 (GB) ............................................. 9818963

(51) Int. Cl.⁷ ................................................ B60Q 1/00
(52) U.S. Cl. ..................... 340/438; 340/431; 340/425.5; 701/34
(58) Field of Search ................................ 340/438, 431, 340/425.5, 458, 447; 701/34, 39; 307/10.8

(56) References Cited

U.S. PATENT DOCUMENTS

| | | | | |
|---|---|---|---|---|
| 4,859,982 A | * | 8/1989 | Seaburg ....................... 340/475 |
| 5,030,938 A | * | 7/1991 | Bondzeit ..................... 340/431 |
| 5,142,278 A | * | 8/1992 | Moallemi et al. ....... 340/825.06 |
| 5,157,376 A | * | 10/1992 | Dietz et al. ................. 340/458 |
| 5,424,720 A | * | 6/1995 | Kirkpatrick ................. 340/585 |
| 5,521,466 A | * | 5/1996 | Vincent ....................... 315/77 |
| 6,100,801 A | * | 8/2000 | Plummer ..................... 340/479 |
| 6,232,722 B1 | * | 5/2001 | Bryant et al. .................. 315/80 |

* cited by examiner

Primary Examiner—Benjamin C. Lee
Assistant Examiner—Phung T Nguyen
(74) Attorney, Agent, or Firm—Andrus, Sceales, Starke & Sawall, LLP

(57) ABSTRACT

The invention concerns an apparatus for monitoring the operation of electrical circuits on a vehicle trailer 10, and has a monitoring unit 18 including a monitor circuit 32 for outputting a signal in response to failure of a component such as a lamp 12a–12d of a trailer electrical circuit. The monitoring unit also has a transmitter 34 for passing a failure indication signal to a receiver 90 of an indicator unit 26 which is mounted in a towing vehicle 14 in a position where it can give an indication of failure of the component to the vehicle driver.

9 Claims, 7 Drawing Sheets

VEHICLE ELECTRICAL CIRCUIT FAILURE MONITOR

CROSS REFERENCE TO RELATED APPLICATION

The present application is the U.S. national stage application of International Application PCT/GB99/02896, filed Sep. 2, 1999, which international application was published on Mar. 16, 2000 as International Publication WO 00/14554 A1 in the English language. The International Application claims the priority of British Patent Application 9818963.2, filed Sep. 2, 1998.

BACKGROUND OF THE INVENTION

This invention relates to an arrangement for monitoring the operation of electrical circuits on a vehicle and, in particular, lamps or other electrical components on a vehicle trailer.

When a trailer (which may be for example a box trailer, a boat trailer or a caravan) is being towed by a vehicle, it is a legal requirement to equip the trailer with a set of rear warning lamps which duplicate the brake lamps, tail lamps and rear turn indicators of the towing vehicle. From time to time, a lamp on the trailer may fail, requiring, for example, the replacement of the lamp bulb. However, because trailer lamps are normally not visible to the driver, the driver may continue to drive unaware that a lamp has failed, which can be dangerous.

Although it is known to have lamp failure monitors for motor vehicle lamps, these are built into the circuitry of the motor vehicle, and therefore cannot be removed for use elsewhere.

SUMMARY OF THE INVENTION

According to the invention, there is provided apparatus for monitoring operation of electrical circuits on a vehicle trailer supplied with electrical power from a towing vehicle via a plug and socket wiring connector, the apparatus comprising a monitoring unit including means for outputting a signal in response to the failure of a component of a trailer electrical circuit; an indicator unit to be mounted in the towing vehicle in a position where it can give an indication to the vehicle driver, the indicator unit including means for indicating to the driver the failure of the component; and means for passing a component failure signal from the monitoring unit to the indicator unit, characterised in that the monitoring unit comprises a plug and socket adapted to be connected in series between the plug and socket otherwise used to connect the vehicle wiring to the trailer wiring, and the means for passing a component failure signal from the monitoring unit to the indicator unit is a radio transmitter and receiver.

The component may be a trailer or other trailer electrical component. The failure of a lamp or other component may be due, for example, to the failure of a bulb within a lamp, a fault with the connections to the socket holding the bulb the failure of a fuse, or any other discontinuity in the trailer circuitry associated with that component, and it will be understood that the term "component failure" includes any such fault.

If one of the trailer components fails, the driver of the towing vehicle will be alerted and will be able to take the appropriate action to replace the component or otherwise correct the fault.

It may be convenient for the monitoring unit and indicator units to be separate units.

The transmitting means contained in the monitoring unit may have a range limited, depending on the system's particular intended use, e.g. say to approximately five metres, sufficient to reach the indicator unit whilst avoiding undue interference with other equipment not on board the vehicle or trailer.

So that the monitoring unit can be easily connected into the electrical circuit powering the trailer electrical components, the monitoring unit may comprise a plug and socket adapted to be connected in series between the plug and socket otherwise used to connect the vehicle wiring to the trailer wiring. The plug and socket may be a standard 7-pin connection as is well known in respect of trailers being towed behind cars and vans. The invention can equally be applied to trailer systems which use different couplings; e.g. the coupling conventionally used on articulated lorries.

Such an arrangement allows the monitoring unit to be removed for use with different trailers or towing vehicles, since the plugs and sockets in existing use are normally standardised.

Means for releasably attaching the monitoring unit to either the towing vehicle or the trailer may be provided.

However, in a preferred embodiment, the monitoring unit comprises a clamp allowing it to be releasably attached to the tow arm of the trailer.

The plug of the monitoring unit connecting to the towing vehicle may be joined to the monitoring unit body via a short cable to allow the monitoring unit body to be positioned conveniently in or on the towing vehicle or trailer.

Since the monitoring unit can be exposed to rain and mechanical shock while the trailer is being towed, the electrical circuitry of the monitoring unit may be housed within a hard casing that is sealed. The casing may be fabricated from a suitable metal, with the inclusion of a non metallic window to allow for the transmission of radio signals from within the casing.

The indicator unit which alerts the driver to a component failure may have a front panel comprising a plurality of lights, each light being designated to turn on in response to a fault in a given trailer component or set of components, e.g., to allow the driver to identify the faulty component of components, the indicator panel may comprise markings or differently coloured lights such as light emitting diodes, for example. The indicator unit could alternatively or additionally emit a distinctive sound to warn of component failure, or provide some other indication to the driver.

The indicator unit may be placed in the driver's compartment and may be powered from an on-board power socket, such as a cigarette lighter socket, for example. However, it is within the scope of the invention for the indicator unit to be powered by a battery housed within the unit.

The monitoring unit may comprise means for monitoring each of a number of trailer components continuously and, upon failure, passing a signal to a multichannel transmitter. However, if a multichannel transmitter is not available, the monitoring unit may comprises means for checking trailer components sequentially in a continuous cycle and, upon failure, passing a signal to a single channel transmitter.

Further examples of trailer electrical circuits that may require monitoring are the battery charging circuit on a caravan, which is powered from the electrical supply of the towing vehicle and refrigeration circuits on articulated lorries.

BRIEF DESCRIPTION OF THE SEVERAL VIEWS OF THE DRAWING

The invention will now be described, by way of example, with reference to the accompanying drawings, in which.

DETAILED DESCRIPTION OF THE INVENTION

The figures show a monitoring circuit suitable for use with a 12 volt car electrical system. The circuit could easily be adapted for use with a 24 volt electrical system such as used on a lorry.

Figure 1:
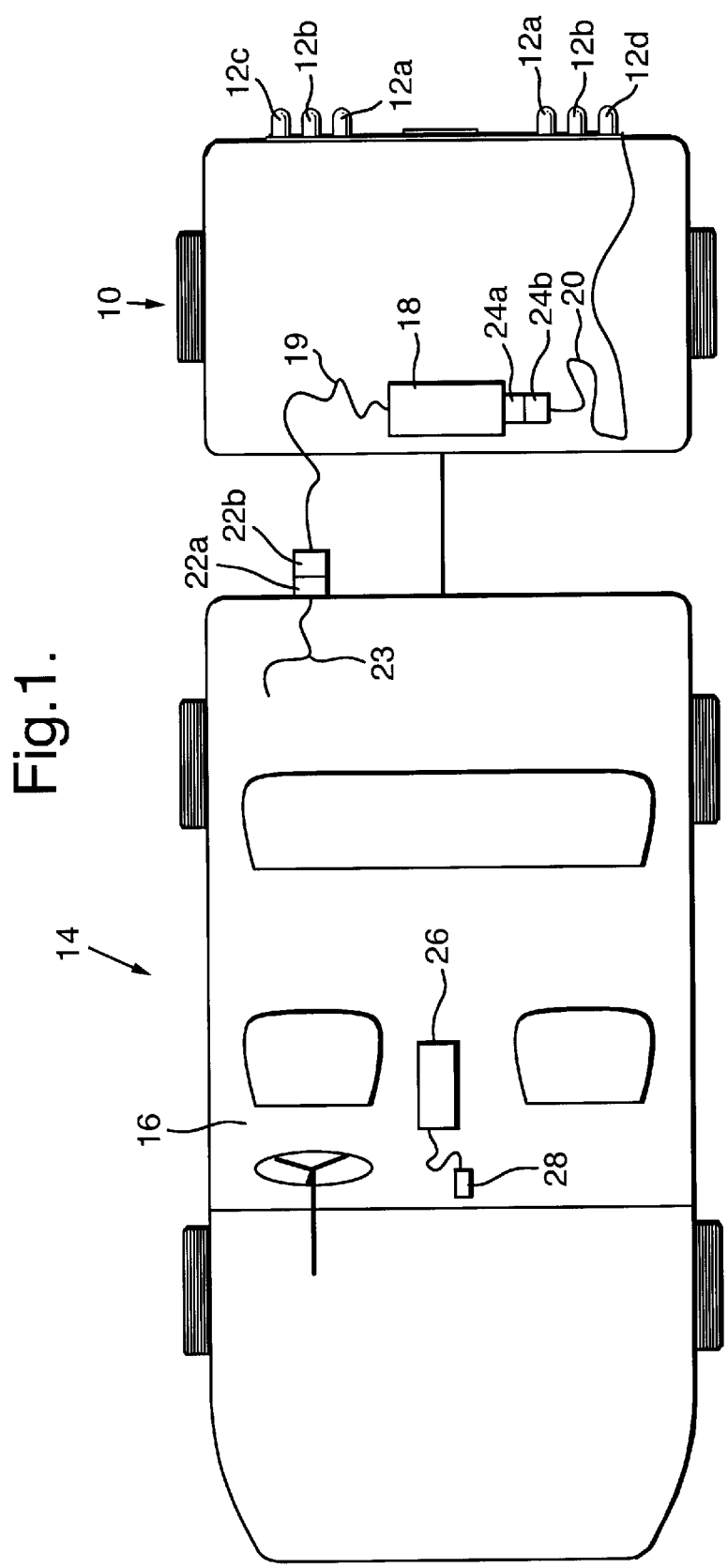
FIG. 1 shows a vehicle towing a trailer and trailer bulb failure monitor, in accordance with the invention.

When a trailer 10 is towed by a vehicle 14 as shown in FIG. 1, a set of trailer lamps 12a–12d, powered by the electrical supply of the vehicle 14, are usually mounted at the rear of the trailer 10 in order to duplicate the rear lights of the vehicle 14.

Without a trailer lamp monitor in place, power to the trailer lamps 12a–12d is delivered from the vehicle 14 via a power cable 20 directly connected to the vehicle 14 by joining a plug 24b and a socket 22a, where the socket 22a is mounted on the vehicle 14 and the plug 24b is joined to the end of the cable 20. When the trailer 10 is unhitched, it is disconnected from the vehicle electrical supply by releasing the plug 24b from the socket 22a.

The monitoring unit 18, shown in place in FIG. 1, includes a plug 22b and a socket 24a which are adapted to connect with the existing socket 22a and plug 24b respectively. Hence, the monitoring unit can easily be inserted into the trailer lamp circuit by disconnecting the socket 22a and the plug 24b from each other and the connecting monitoring unit 18 between them, without any modification being required of the existing trailer lamp circuit components.

In the present example, the socket 24a is mounted on the body of the monitoring unit 18 directly, whereas the plug 22b is linked to the monitoring unit body via a cable 19. This allows the monitoring unit body to be carried in or on the trailer, but it is within of the scope of the invention for the monitoring unit body to be carried in or on the vehicle 14.

The monitoring unit 19 can be detachably mounted on a trailer or vehicle, for example with the use of clamps, thereby allowing it to be switched from one trailer to another.

When an attempt is made by the vehicle driver to activate a non functional trailer lamp or set of lamps, circuitry within the monitoring unit 18 emits a radio frequency fault signal corresponding to that lamp or set of lamps, which is received by an indicator unit 26 located in the driver compartment 16 of the vehicle 14.

The indicator unit 26 is equipped with a front panel, on which a plurality of light emitting diodes are mounted to alert the driver of a trailer lamp fault. Circuitry included within the indicator unit enables each diode to become lit in response to a given fault signal which corresponds to a given trailer lamp or set of lamps, thereby enabling the driver to identify the faulty lamp or set of lamps.

In the present example, the indicator unit 26 is powered by the vehicle electrical supply via a plug 28 adapted to connect with an on board power socket such as the cigarette lighter socket of the vehicle, although it is within the scope of the invention for the indicator to be powered by a battery housed within the indicator unit.

Figure 2:
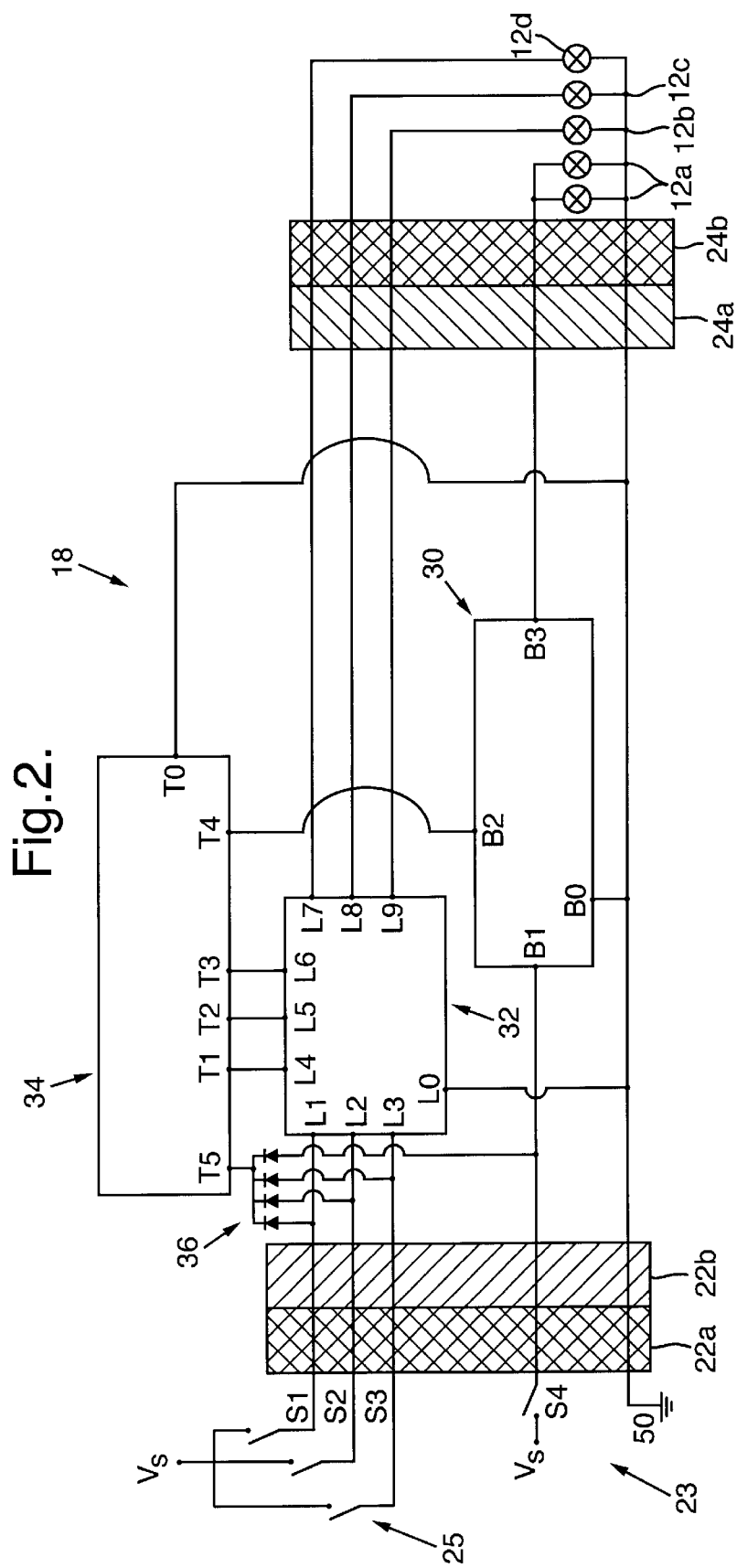
FIG. 2 shows a block diagram of a monitoring unit circuit.

A block diagram illustrating the electrical circuit of the monitoring unit 18 is shown in FIG. 2. The circuit comprises a brake lamp monitor board 30 and a lamp monitor board 32, the brake lamp monitor board 30 monitoring the operation of the brake lamp 12a, and the lamp monitor board 32 monitoring the remaining trailer lamps 12b–12d, each board being capable of producing a fault signal in response to a fault in a given trailer lamp, and passing the fault signal to a transmitter circuit 34.

The monitoring unit circuit is wired to the plug 22b and the socket 24a, which are schematically shown connected to socket 22a and plug 24b of the vehicle and trailer respectively. For clarity, a simplified version of the vehicle circuit 23 is included, showing the vehicle lamp power supply at voltage Vs and supply rails S1–S4 wired to the socket 22a with their corresponding lamp switches 25 in series with the power supply. A typical trailer lamp circuit wired to the plug 24b is also shown, with each of the trailer lamps 12a–12d being connected to a respective supply rail S1–S4 at one terminal, and to the ground rail S0 at the other terminal.

In the present example the supply voltage Vs is chosen to be positive and is provided by the vehicle battery, which is normally at a voltage of 12 V.

The lamp monitoring board contains three independent channels with respective channel input and output L1 and L7 for the first channel, L2 and L8 for the second channel, and L3 and L9 for the third channel, the channels being placed in series with the supply rails S1, S2 and S3 respectively. In a similar fashion, the brake lamp monitor board 30 contains a single channel in series with a supply rail S4, with channel input and output B1 and B3 respectively.

Channel outputs L7, L8, L9 and B3 are low impedance outputs in order to ensure that the intensity of the lamps is not significantly attenuated by the presence of the monitoring boards.

When a supply rail S1–S4 rises to voltage Vs due to the closure of a corresponding switch 25, a current flows through the lamp and that supply rail if the lamp is functional. If the lamp becomes non functional, no current flows through the supply rail for that lamp but the rail remains at voltage Vs provided the corresponding switch remains closed.

Current measurement circuitry present in each channel of the lamp monitor board produces a fault signal at a signal output L4–L6 when a respective supply rail S1–S3 is not passing current and the switch to that supply rail is closed, these two conditions together being indicative of lamp failure, the closure of the switch being determined from the voltage of the supply rail, which is close or equal to Vs independent of the lamp when the switch is closed. In a similar fashion, brake monitor board 30 produces a fault signal at signal output B2 in response to a null current reading through supply rail S4.

A fault signal at a signal output L4, L5, L6 or B2 of a monitor board is represented by a low state of that output, the high state of that output being indicative of correct lamp operation.

Fault signals from the signal outputs L4, L5, L6 and B2 of the monitor boards are passed to respective inputs T1, T2, T3 and T4 of the transmitter circuit 34, and are subsequently radio transmitted to the indicator unit 26.

The transmitter circuit 34 is powered by supply rails S1–S4 via supply input T5 when at least one of the corresponding switches is closed, this arrangement conveniently ensuring that the transmitter circuit is only powered when the lamps are required to be illuminated. Similarly, the monitor boards are powered by the supply rails feeding into inputs L1–L3 and B1.

A diode 36 is provided between each supply rail and the transmitter circuit supply input T5, the diodes being orientated so that each diode faces input T5 in order to isolate the supply rails from each other.

The brake lamp monitor board 30, the other lamp monitor board 32 and transmitter circuit 34 are each provided with a respective ground terminal B0, L0, and T0, each terminal being connected to the ground rail S0.

Figure 3:
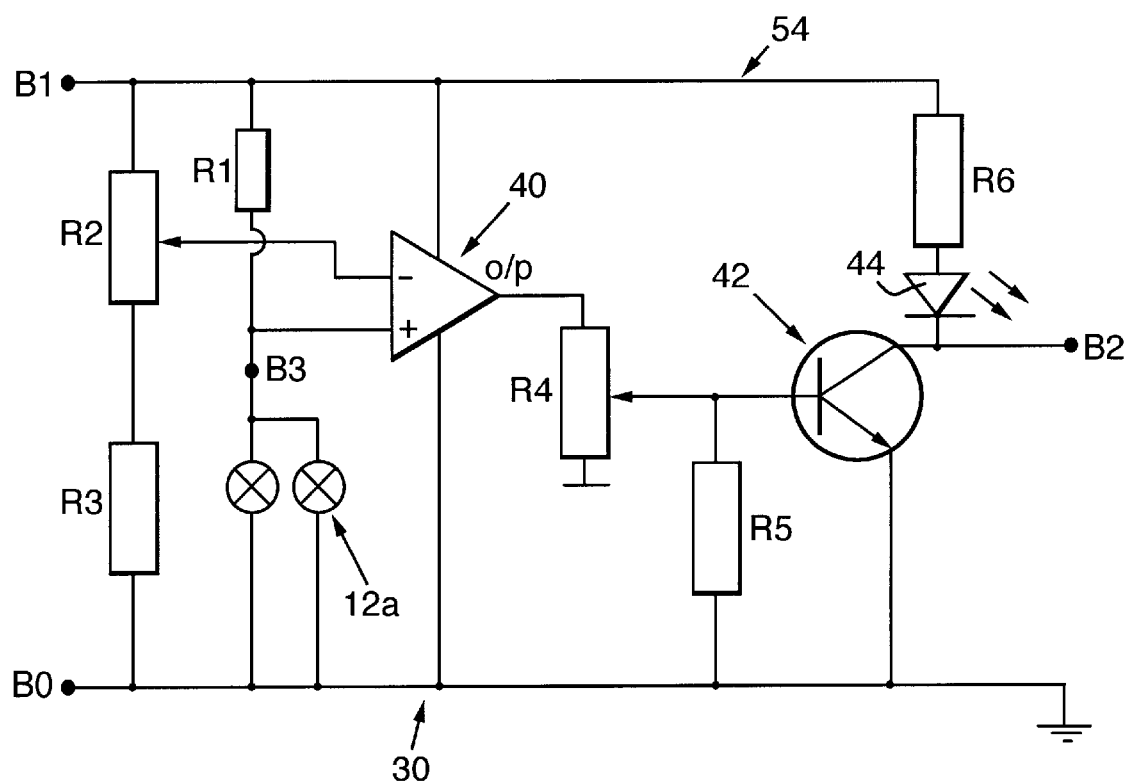
FIG. 3 shows a detailed representation of a possible brake monitor board circuit.

One embodiment of the brake lamp monitor board 30 is shown in FIG. 3, where connections B0, B1, B2 and B3 correspond to those in FIG. 2. Brake lamps 12a connected in parallel between B3 and ground are also shown. When the supply rail S4 is at Vs, a first potential divider between the supply rail S4 and the ground rail S0 formed by the brake lamps in series with a resistor R1 defines a voltage V+ at the non inverting input (+) of an operational amplifier 40 acting as a comparator. A variable resistor R2 and a resistor R3 in series form a second potential divider in parallel with the first, that defines a voltage V−, adjustable by means of a variable resistor R2 at the inverting input (−) of the operational amplifier 40 whose output is connected via an adjustable potential divider R4 and R5 to the base of a npn transistor 42 which acts as a switch to the resistor R6 and light emitting diode 44 in series between the collector of the transistor 42 and the supply rail S4, the emitter of the transistor being connected directly to ground.

The variable resistor R2 is adjusted and the resistor values R1 and R3 are chosen so that when both brake lamps are operational, V+ is less than V− and therefore the output of the operational amplifier 40 is close to ground, with the result that the npn transistor 42 is cut off and signal output B2 at the emitter terminal is close to Vs and is therefore high.

Failure of one or both lamps causes the voltage V+ at the non inverting input (+) to rise to a value greater than the voltage V− at the inverting input (−), with the result that the operational amplifier output is close to the positive supply voltage Vs and the npn transistor is biased into conduction mode, allowing current to flow through the resistor R6 and light emitting diode 44 in series between the collector and the supply rail, which causes output B2 to be close to ground and therefore low, the low state of output B2 constituting a fault signal.

Appropriate biasing of the npn transistor 42 when the operational amplifier output is close to the positive supply voltage is achieved via the adjustable potential divider at the operational amplifier output formed by a variable resistor R4 and resistor R5 in series.

Figure 4:
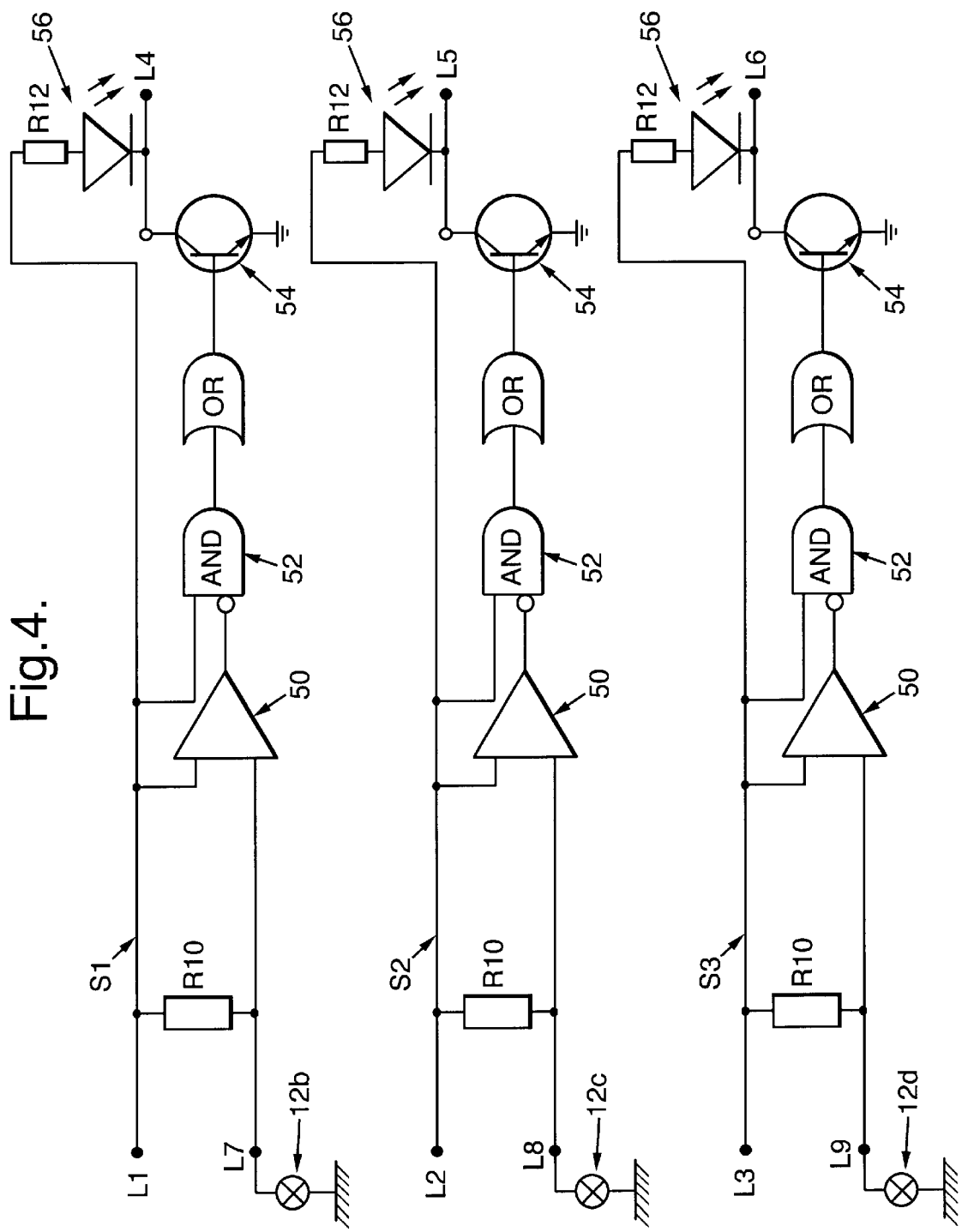
FIG. 4 shows a detailed representation of a possible lamp monitor board circuit

FIG. 4 shows a possible logic circuit for the lamp monitor board, where each channel includes a differential amplifier 50 whose inputs are placed across a resistor R10. The monitor board inputs and outputs are labelled as in FIG. 2.

With reference to the channel with channel input L1 as an example, it can be seen that when L1 is at the supply rail voltage Vs and when the corresponding lamp 12b in the circuit is on, the current through the resistor R10 causes a voltage to develop across its terminals, which is amplified by the differential amplifier 50, causing the voltage at the inverted input of an AND gate 52 connected to the output of the differential amplifier to be high. Consequently, the output of the AND gate 52 is low, and therefore the npn transistor 54 is cut off, since it is connected at the base to the AND gate output and grounded at the emitter, resulting in a negligibly small current flow though the resistor R12 and the light emitting diode 56 connected in series between the collector of the npn transistor 54 and the channel input L1. Hence the signal output L4 at the collector transistor 54 is close to the supply rail voltage Vs and is therefore high.

When the lamp 12b is non functional, a voltage Vs applied at L1 results in the same voltage appearing at L7, since no current is passed through the resistor R10. Hence there is no voltage difference between the inputs of the differential amplifier 50 and the amplifier output appearing at the inverted input of the AND gate 52 is low. Since the other AND gate input is connected to channel input L1 at voltage Vs and is therefore high, the AND gate output biasing the base of transistor 54 is also high, with the result that the transistor 54 is in conduction mode and signal output L4 goes low, the low state of signal output L4 constituting a fault signal.

The other channels of the lamp monitor board operate in the same way, producing a low signal output when the corresponding lamp in the circuit is non functional and the supply voltage Vs is applied to the channel input.

Additional channels may be incorporated into the lamp monitor if required, not necessarily according to the circuit of the existing channels.

The light emitting diodes 44 and 56 in or on the monitoring unit are optional, being provided to indicate lamp failure without a separate indicator unit, for example during tests.

Figure 5:
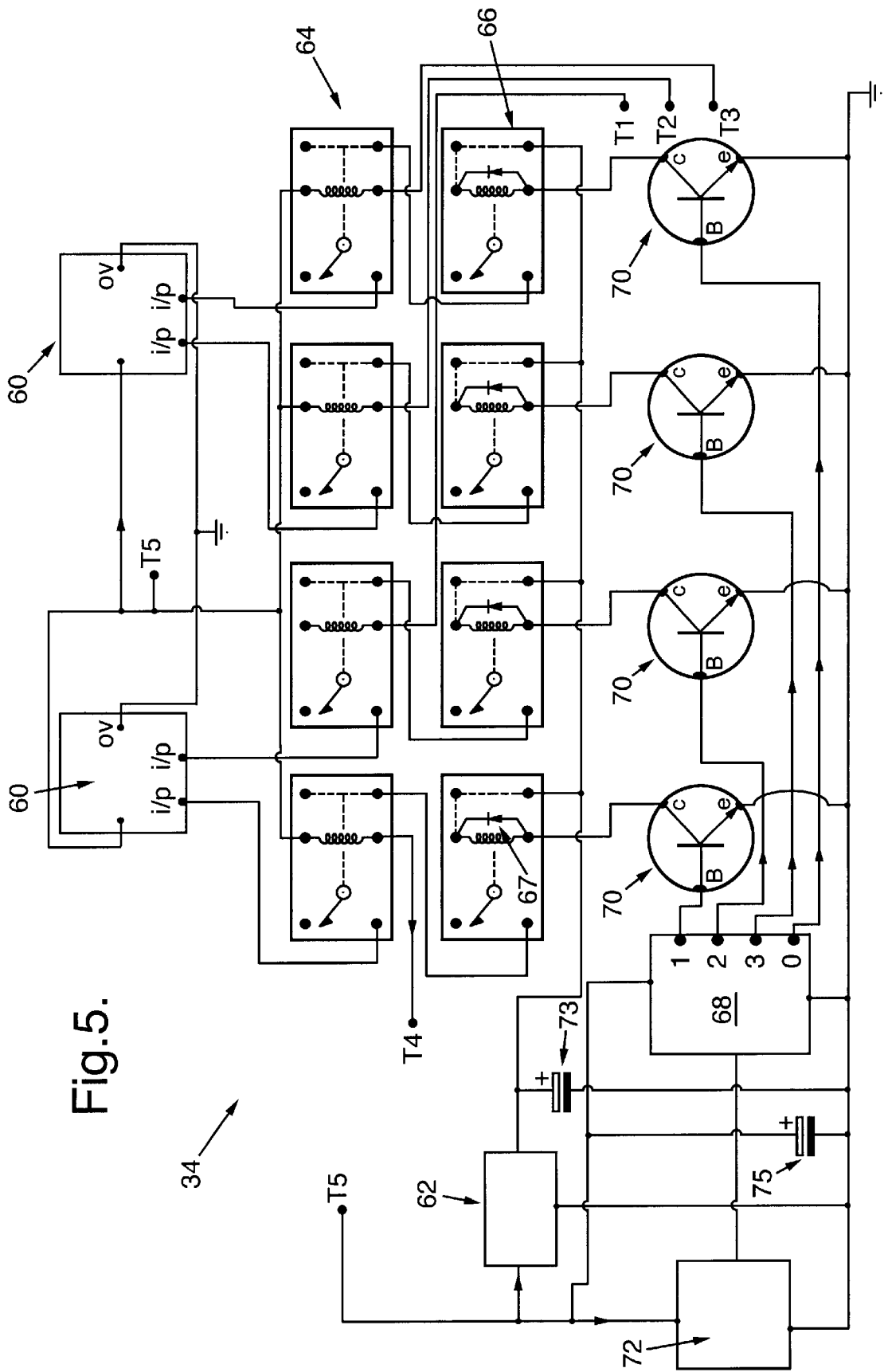
FIG. 5 shows a detailed representation of a possible transmitter circuit arrangement and sequential decoder arrangement.

A possible configuration of the transmitter circuit 34 is shown in FIG. 5. Single channel transmitters 60 transmit a radio frequency fault signal when a regulated voltage from a regulator 62 is applied to one of the transmitter inputs. Each transmitter input is connected to the regulator output via a respective pair of switches in series formed by a by a first relay switch 64 and a second relay switch 66.

Each of the first relay switches 64 is controlled by a respective signal input T1–T4, each becoming closed in response to a fault signal at that input. Each of the second relay switches 66 is controlled by a counter 68 through a corresponding set of npn transistors 70, the counter being operated by a timer 72. The counter 68 sequentially causes each switch 66 to be closed for a time in a cyclic manner, such that only one of the second set of switches are closed at any given moment.

Only when both relays of a given pair are closed is the voltage from the regulator passed to the transmitter, resulting in a fault signal being transmitted. This arrangement prevents two or more fault signal being passed to a transmitter simultaneously, which is necessary since the transmitters 60 operate on a single channel.

The relays 66 are driven by the output from the regulator 62 connected to one terminal of the relay coil, with a return to ground at the other terminal provided by npn transistors 70 acting as a switch capable of being biased at the base into conduction by a high signal from the counter 68. Thus a high signal from the counter 68 to a given transistor allows a current to flow through the corresponding relay coil which closes the corresponding switch in the relay. A protector diode 67 in parallel with the relay coil of each relay 66 is included to prevent damage to the transistors 70.

The relays 64 are driven directly by a supply rail via supply input T5. A path to ground though each relay coil is provided by a signal input T1–T4 when that input goes low, thereby closing the corresponding relay switch.

The regulator 62, counter 68, timer 72 and transmitters 60 are powered by a supply rail through input T5, with electrolytic smoothing capacitors 73 and 75 provided at the regulator output and at the supply to the counter 68 respectively. This relay type circuit may, of course, be replaced by one using solid state components.

Figure 6:
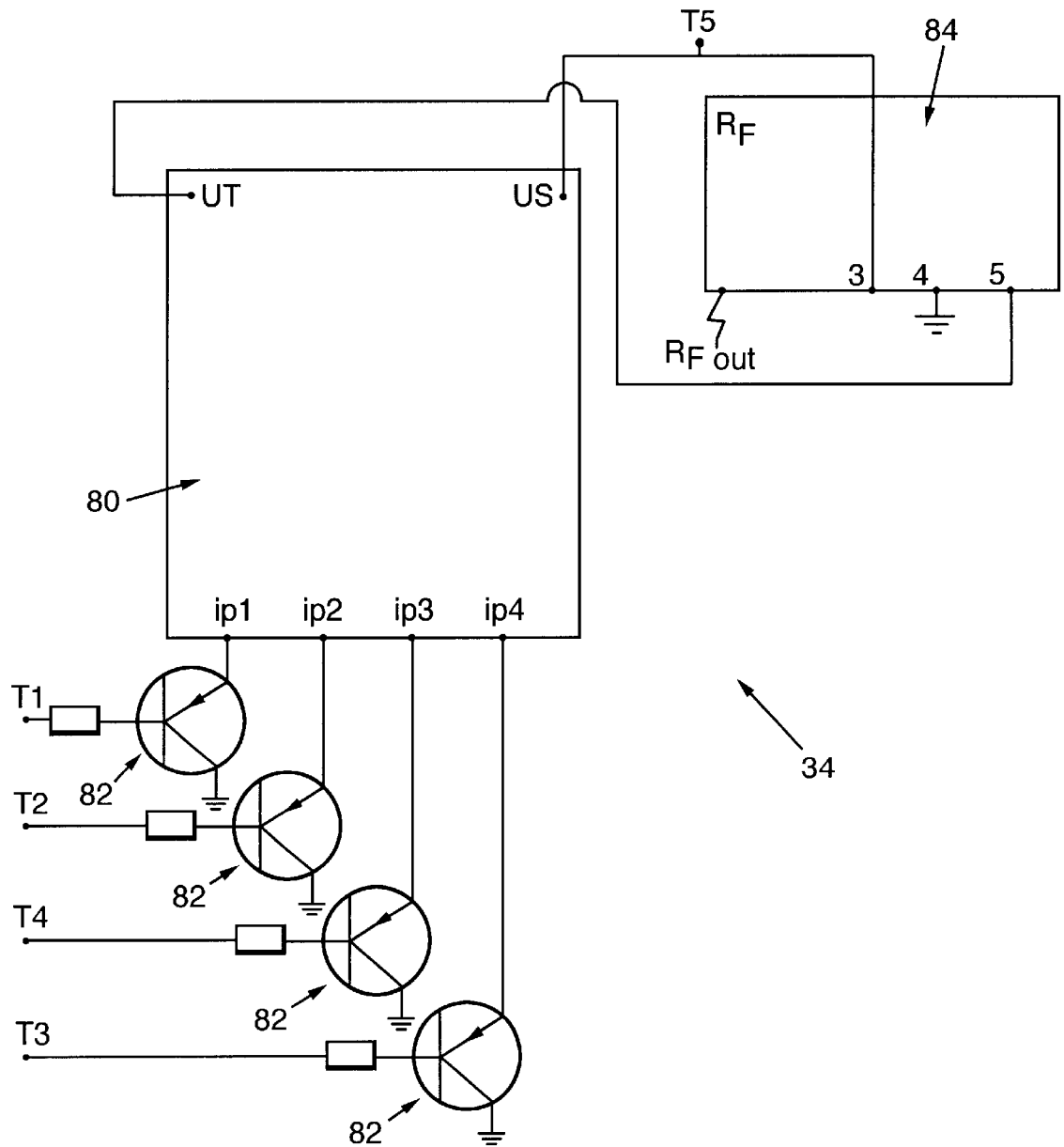
FIG. 6 shows a block diagram of an alternative signal transmitter unit.

An alternative configuration of the transmitter circuit is shown in FIG. 6. In this example, each of the signal inputs T1–T4 is passed to an input ip1–ip4 of a signal transmitter 80 via a set of pnp transistors 82 in the emitter follower configuration. Each input of the signal transmitter operates on a single channel, the signal transmitter transforming the single channel inputs to form a multi channel single output passed to a radio transmitter 84 which transmits a radio frequency fault signal. The transmitted fault signals are received by the indicator unit 26.

Figure 7:
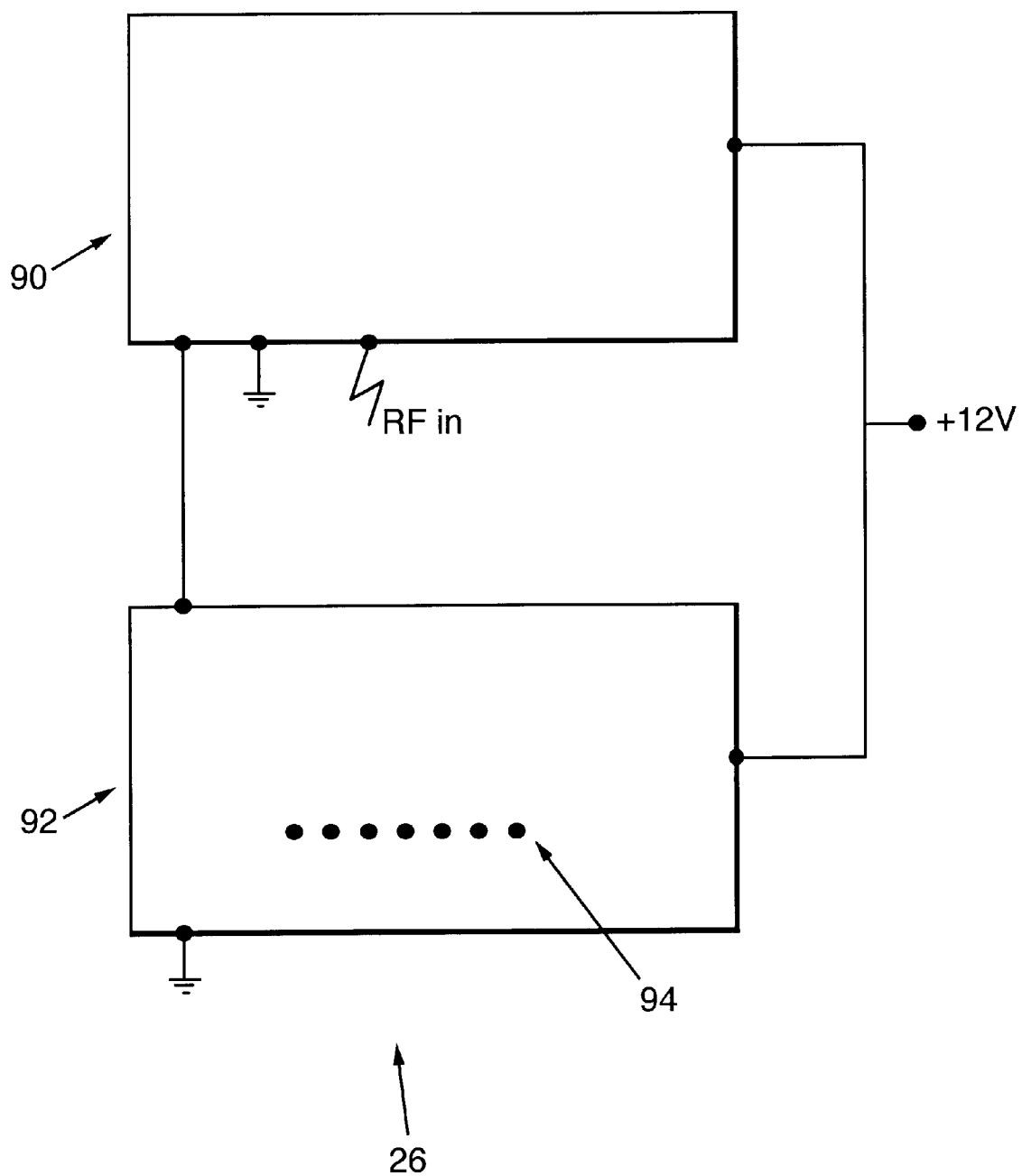
FIG. 7 shows a block diagram of a signal receiver unit.

A block diagram for the indicator unit circuitry is shown in FIG. 7. A radio frequency receiver 90 picks up a radio frequency fault signal sent by the radio transmitter 60,84 and passes the corresponding data to a signal receiver 92, the signal receiver 92 being capable of decoding that data in order to identify the signal input in the monitoring unit that is registering the fault signal, and as a result of the identification, illuminating one or more designated light emitting diodes 94 on the front panel of the indicator unit. Illumination of the light emitting diodes 94 will indicate to a driver that a lamp in the trailer has failed.

What is claimed is:

1. Portable apparatus suitable for being temporarily placed in a given towing vehicle (14) and associated vehicle trailer (10) combination when it is desired to monitor the operation of electrical circuits of the vehicle trailer, the electrical circuits being supplied with electrical power from the towing vehicle via a plug (24b) and socket (22a) wiring connector, the apparatus being removable from the towing vehicle and trailer of the given combination when towing is concluded or monitoring is no longer desired, the apparatus being transferable to other towing vehicle and vehicle trailer combinations for which monitoring is desired, the apparatus comprising:

a transportable monitoring unit (18) suitable for being removably placed on a selected vehicle trailer when it is desired to monitor the operation of electrical circuits in the trailer, said monitoring unit having a plug (22b) and socket (24a) adapted to be removably connected in series between the plug (24b) and socket (22a) otherwise used to supply power to the trailer electrical circuits, said monitoring unit including means (32) for outputting a signal in response to the failure of a component (12a–12d) of a trailer electrical circuit;

a transportable indicator unit (26) suitable for being removably placed in the towing vehicle in a position where it can provide an indication to the vehicle driver, said indicator unit including means (94) for indicating to the driver the failure of a component of a trailer electrical circuit; and means (34, 90) for transmitting a component failure signal from the monitoring unit to the indicator unit for causing the indicator unit to provide a component failure indication to the vehicle driver, said means comprising a wireless radio transmitter (34, 60, 84) in the monitoring unit and a wireless receiver (90) in the indicator unit.

2. Apparatus according to claim 1, wherein the monitoring unit (18) is housed within a hard casing that is sealed.

3. Apparatus according to claim 1, wherein the indicator unit (26) has a front panel comprising a plurality of lights (94), each light being designated to turn on in response to a failure of a given trailer component or set of components.

4. Apparatus according to claim 1, wherein the monitoring unit (18) includes means for monitoring each of a number of trailer components continuously and passing a signal to a multichannel, wireless radio transmitter.

5. A vehicle (14) and trailer (10) having apparatus according to claim 1 and a component (12a–12d) to be monitored.

6. A vehicle (14) and trailer (10) according to claim 5, wherein the component is a lamp (12a–12d).

7. A vehicle (14) and trailer (10) according to claim 5, wherein the component is a battery charging circuit.

8. A vehicle (14) and trailer (10) according to claim 5, wherein the component is a refrigeration unit.

9. Apparatus according to claim 1, wherein said indicator unit is battery operated.

* * * * *